United States Patent
Hintermaier et al.

(10) Patent No.: US 6,605,505 B2
(45) Date of Patent: Aug. 12, 2003

(54) PROCESS FOR PRODUCING AN INTEGRATED SEMICONDUCTOR MEMORY CONFIGURATION

(75) Inventors: Frank Hintermaier, München (DE); Carlos Mazure-Espejo, Zorneding (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/883,011

(22) Filed: Jun. 15, 2001

(65) Prior Publication Data

US 2001/0039106 A1 Nov. 8, 2001

Related U.S. Application Data

(62) Division of application No. 09/282,097, filed on Mar. 30, 1999, now Pat. No. 6,297,526, which is a continuation of application No. PCT/DE97/02033, filed on Sep. 11, 1997.

(30) Foreign Application Priority Data

Sep. 30, 1996 (DE) .......................... 196 40 413

(51) Int. Cl.⁷ .......................... H01L 21/8242
(52) U.S. Cl. .......................... 438/244; 438/3; 438/240; 438/241; 438/396
(58) Field of Search .......................... 438/3, 240, 241, 438/244, 396

(56) References Cited

U.S. PATENT DOCUMENTS

| 5,313,089 A | 5/1994 | Jones, Jr. .................... 257/295 |
| 5,329,486 A | 7/1994 | Lage .......................... 365/145 |
| 5,436,477 A | 7/1995 | Hashizume et al. ........ 257/310 |
| 5,439,840 A | 8/1995 | Jones, Jr. et al. ............... 438/3 |
| 5,495,117 A | 2/1996 | Larson ........................ 257/295 |
| 5,506,166 A | 4/1996 | Sandhu et al. ............. 438/396 |
| 5,567,636 A | 10/1996 | Jones, Jr. ........................ 438/3 |
| 5,585,998 A | * 12/1996 | Kotecki et al. .......... 361/321.4 |
| 5,914,851 A | * 6/1999 | Saenger et al. ............. 361/311 |
| 5,959,319 A | 9/1999 | Iwasa ......................... 257/296 |
| 6,297,526 B1 | * 10/2001 | Hintermaier et al. ........ 257/306 |

FOREIGN PATENT DOCUMENTS

DE 42 23 878 A1 1/1994

OTHER PUBLICATIONS

"A new stacked capacitor cell with thin box structured storage node" (Inoue et al.), Extended Abstracts of the 21$^{st}$ Conference on Solid State Devices and Material, Tokio 1989, pp. 143–146.

* cited by examiner

*Primary Examiner*—Amir Zarabian
*Assistant Examiner*—Jeff Vockrodt
(74) *Attorney, Agent, or Firm*—Laurence A. Greenberg; Werner H. Stemer; Ralph E. Locher (57) ABSTRACT

A process for producing an integrated semiconductor memory configuration, in particular one suited to the use of ferroelectric materials as storage dielectrics, in which a conductive connection between one electrode of a storage capacitor and a selection transistor is not produced until after the storage dielectric has been deposited; and a semiconductor memory configuration produced using the production process.

8 Claims, 7 Drawing Sheets

PROCESS FOR PRODUCING AN INTEGRATED SEMICONDUCTOR MEMORY CONFIGURATION

CROSS-REFERENCE TO RELATED APPLICATION

This is a division of U.S. application Ser. No. 09/282,097, filed Mar. 30, 1999 is now U.S. Pat. No. 6,297,526, which was a continuation of copending International Application PCT/DE97/02033, filed Sep. 11, 1997, which designated the United States.

BACKGROUND OF THE INVENTION

FIELD OF THE INVENTION

The invention relates to a process for producing an integrated semiconductor memory configuration.

Semiconductor-based memory configurations usually comprise a number of memory cells which each have a selection transistor and a storage capacitor connected to the selection transistor. During a production process for such semiconductor memory configurations, it is usual to apply first electrodes over conductive connections, a respective one of the conductive connections connecting one of the first electrodes to a respective one of the selection transistors. A storage dielectric is applied over the first electrode and in turn has a second electrode applied to it, so that the first and the second electrode as well as the intermediate storage dielectric form a storage capacitor which is conductively connected to one of the selection transistors.

The use of new types of ferroelectric materials as the storage dielectric for storage capacitors allows semiconductor memories to be produced that do not lose their information (stored in the form of electric charge) after a supply voltage failure, and whose memory contents do not have to be refreshed at regular intervals as a result of leakage currents.

A critical factor for the use of most of the previously known ferroelectric materials of this type is their processing within a semiconductor process. Most ferroelectric materials of this type are deposited at high temperatures in an atmosphere containing oxygen. The use of such ferroelectric materials in the process described above, in which the storage dielectric is applied over the first electrode, which in turn is situated above a conductive connection to one of the selection transistors, results in oxidation of the conductive connection because, during deposition of the ferroelectric materials, oxygen diffuses through the first electrode in the direction of the conductive connection and oxidizes the latter. Oxidation of the conductive connection interrupts the electrical connection between the storage capacitor and the selection transistor of a memory cell, with the result being that the latter is no longer functional.

Solutions for preventing oxidation of the conductive connection during deposition of a ferroelectric storage dielectric call for applying barrier layers between the conductive connection and the first electrode, in which case the barrier layers have to be electrically conductive but capable of resisting oxidation and diffusion of oxygen. A disadvantage of the use of barrier layers is that it is hard to find suitable materials that are electrically conductive, impermeable to oxygen, capable of resisting oxidation and that can be suitably applied to the conductive connections.

A process for producing an integrated semiconductor memory configuration having a ferroelectric storage dielectric without using barrier layers is described in U.S. Pat. No. 5,439,840. In this described process, the first electrodes, the storage dielectric and the second electrode are applied over an insulation layer which is situated above selection transistors, using deposition processes. Subsequently, contact holes extending to the selection transistors are produced through the second electrode, the storage dielectric, the first electrode and the insulation layer and can be used to make electrical contact between the second electrode and the selection transistor. The particular disadvantage of this is the complex application of a further insulation layer in the contact hole in order to provide electrical insulation between the first electrode and the second electrode.

SUMMARY OF THE INVENTION

It is accordingly an object of the present invention to provide a process for producing an integrated semiconductor memory configuration, in which ferroelectric materials are used to produce storage dielectrics for storage capacitors, and in which the use of barrier layers between the conductive connection and the first electrode can be dispensed with, so that the above-mentioned disadvantages do not arise.

With the foregoing and other objects in view there is provided, in accordance with the invention, a first embodiment of a process for producing an integrated semiconductor memory configuration, which comprises:

providing a configuration of selection transistors having source regions and an insulation layer formed with contact holes extending through to the source regions;

subsequently providing first contact plugs in the contact holes;

subsequently applying at least one first electrode on a surface of the insulation layer; and forming the first electrode with cutouts exposing surfaces of the first contact plugs and regions of the surface of the insulation layer adjacent the contact holes;

subsequently depositing a dielectric layer on the surfaces of the first contact plugs, the regions of the surface of the insulation layer adjacent the contact holes, and the first electrode;

subsequently depositing a second layer of electrode material on the dielectric layer;

subsequently separating the second layer of electrode material into sections to produce second electrodes;

subsequently exposing the surfaces of the first contact plugs; and subsequently producing second contact plugs above the exposed first contact plugs electrically connecting a respective one of the second electrodes to a respective one of the first contact plugs.

With the foregoing and other objects in view there is provided, in accordance with the invention, a second embodiment of a process for producing an integrated semiconductor memory configuration, which comprises:

providing a configuration of selection transistors having source regions and an insulation layer formed with contact holes extending through to the source regions;

subsequently providing first contact plugs in the contact holes;

subsequently applying at least one first electrode on a surface of the insulation layer; and forming the first electrode with cutouts exposing surfaces of the first contact plugs and regions of the surface of the insulation layer adjacent the contact holes;

subsequently depositing a dielectric layer on the surfaces of the first contact plugs, the regions of the surface of the insulation layer adjacent the contact holes, and the first electrode;

subsequently exposing the surfaces of the first contact plugs;

subsequently depositing a second layer of electrode material on the exposed surfaces of the first contact plugs and on the dielectric layer; and subsequently separating the second layer of electrode material into sections to produce second electrodes.

In accordance with an added feature of the invention, the first electrode application step is performed by depositing a layer of electrode material; and the step of forming cutouts is performed by removing the layer of electrode material from the surfaces of the first contact plugs and regions of the surface of the insulation layer adjacent the contact holes.

In accordance with an additional feature of the invention, before the first electrode application step, a structured auxiliary layer is applied on the surface of the insulation layer; and the structured auxiliary layer is formed with cutouts exposing surfaces of the first contact plugs and regions of the surface of the insulation layer adjacent the contact holes.

In accordance with an another feature of the invention, a material having ferroelectric properties is selected as the dielectric layer.

In accordance with a further feature of the invention, a material having ferroelectric properties is selected as the dielectric layer.

In accordance with another added feature of the invention, a material having a dielectric constant greater than 10 is selected as the dielectric layer.

In accordance with another additional feature of the invention, a an oxide-containing material selected from the group consisting of $SrBi_2(Ta_{1-x}Nb_x)_2O_9$, $Pb(Zr, Ti)O_3$, $(Ba, Sr)TiO_3$, and $SrTiO_3$ is selected as the dielectric layer.

With the foregoing and other objects in view there is also provided, in accordance with the invention, a first embodiment of an integrated semiconductor memory configuration comprising:

a plurality of identical memory cells each including:
a selection transistor having a source region;
an insulation layer having a surface and being disposed above the selection transistor; the insulation layer having a contact hole formed therein above the source region of the selection transistor;
a first contact plug disposed in the contact hole and being conductively connected to the source region;
a first electrode disposed on the surface of the insulation layer;
a dielectric layer disposed on the first electrode;
a second electrode disposed on the dielectric layer and being electrically isolated from the first electrode by the dielectric layer; and
a second contact plug electrically connecting the second electrode to the first contact plug and being electrically isolated from the first electrode by a portion of the dielectric layer.

In accordance with an added mode of the invention, a structured auxiliary layer is disposed between the surface of the insulation layer and the first electrode; the auxiliary layer being formed with a cutout disposed above the contact hole and above regions of the surface of the insulation layer adjacent the cutout.

With the foregoing and other objects in view there is also provided, in accordance with the invention, a second embodiment of an integrated semiconductor memory configuration comprising:

a plurality of identical memory cells each including:
a selection transistor having a source region;
an insulation layer having a surface and being disposed above the selection transistor; the insulation layer having a contact hole formed therein above the source region of the selection transistor;
a first contact plug disposed in the contact hole and being conductively connected to the source region;
a structured auxiliary layer disposed on the surface of the insulation layer; the auxiliary layer being formed with a cutout disposed above the contact hole and above regions of the surface of the insulation layer adjacent the cutout;
a first electrode disposed on the structured auxiliary layer;
a dielectric layer disposed on the first electrode;
a second electrode disposed on the dielectric layer and being electrically isolated from the first electrode by the dielectric layer; and
a second contact plug electrically connecting the second electrode to the first contact plug and being electrically isolated from the first electrode by a portion of the dielectric layer.

In accordance with an additional mode of the invention, the second contact plug is an integral part of the second electrode.

In accordance with another mode of the invention, the dielectric layer is a material having ferroelectric properties.

In accordance with a further mode of the invention, the dielectric layer is a material having a dielectric constant greater than 10.

In accordance with a concomitant mode of the invention, the dielectric layer is an oxide-containing material selected from the group consisting of $SrBi_2(Ta_{1-x}Nb_x)_2O_9$, $Pb(Zr, Ti)O_3$, $(Ba, Sr)TiO_3$, and $SrTiO_3$.

In the inventive process for producing an integrated semiconductor memory configuration, a conductive connection is produced between one of the two electrodes, in this example, the second electrode, and the selection transistor only after the storage dielectric has been deposited. The conductive connection between the source region of the selection transistor and the second electrode is produced above the first and the second contact plug in the present invention. Oxidation of surfaces of the first contact plugs is acceptable when the dielectric layer is being deposited. This is because in one of the next process steps, when the first contact plugs are exposed and before the second contact plugs are produced, oxidized regions of the surfaces of the first contact plugs can be removed. The process is suitable with use of any desired dielectric as the storage dielectrics in storage capacitors in integrated semiconductor memory configurations. It is particularly suitable with use of ferroelectric materials as storage dielectrics, because in this process the above-mentioned problems, such as oxidation of the conductive connection to the selection transistors during deposition of the storage dielectric, cannot arise, since the conductive connection is not produced until after the storage dielectric has been deposited. In addition, the process is simple to carry out with previously known processes for producing integrated semiconductor memory configurations.

There are various conceivable processes for producing the first electrodes above the first main surface of the insulation layer. One embodiment of the invention enables production of the first electrodes by depositing a first layer of electrode material in the direction of the first main surface. The first layer is subsequently removed, preferably by anisotropic etching, from the top surfaces of the first contact plugs that are situated in the first main surface and from regions of the first main surface that are adjacent to the top surfaces of the first contact plugs. Cutouts in the first layer are thereby produced with areas that are larger than the top surfaces of the first contact plugs. In the semiconductor memory configuration produced using the process a dielectric layer is deposited in a following process step. Parts of the dielectric layer that are situated on the exposed regions of the first main surface isolate the second contact plugs which are electrically connected to the second electrode, from the first electrode.

A further embodiment of the invention enables production of the first layer by depositing electrode material on an auxiliary layer that is structured to have cutouts above the first contact plugs. The cutouts expose the surfaces of the first contact plugs as well as adjacent regions of the first main surface. After the first layer of electrode material has been deposited, the first layer is removed from the surfaces of the first contact plugs and adjacent regions of the first main surface. The application of the first electrodes over the auxiliary layer causes an increase in the surface area of the first electrode. This is because the first electrode also extends over lateral surfaces of the cutouts in the auxiliary layer in addition to surfaces of the auxiliary layer which run parallel to the first main surface. An increase in the surface area of the first electrode increases the capacitor surface area of the produced storage capacitors, and thus increases the storage capacity.

A further embodiment of the invention provides for the surfaces of the first contact plugs to be exposed right after the dielectric layer has been deposited and before the second layer of electrode material is deposited, and for any oxidized regions of the first contact plugs to be removed. This process provides the advantage that, in one of the next process steps, the second layer of electrode material can be applied directly over the first contact plugs, so that there is no need to produce a second contact plug. This process is particularly suitable if, after the dielectric layer has been deposited, there are no other required process steps in which the first contact plugs could be oxidized.

The ferroelectric properties of most of the previously known ferroelectric materials that may be used as the storage dielectric in one embodiment of the invention are temperature-dependent. These ferroelectric materials have a ferroelectric behavior below a characteristic or particular temperature, whereas they behave paraelectrically above this characteristic or particular temperature. The dielectric constant in the paraelectric state is considerably higher than the dielectric constants of previously used storage dielectrics. The temperature below which ferroelectric properties are established is very low for some ferroelectric materials, so that, from a technical point of view, these ferroelectric materials are always used in the paraelectric state. The dielectric constant of a selected ferroelectric material in the paraelectric state is above 10, and is preferably above 100.

One feature of the invention provides for the storage dielectrics used to be materials whose dielectric constant is higher than 10. Such materials may be the above-mentioned ferroelectric materials, for example, which are used above their characteristic temperature.

One feature of the invention provides for an oxide-containing dielectric to be used as storage dielectrics. The class of these substances includes, for example, SBTN $SrBi_2(Ta_{1-x}Nb_x)_2O_9$, PZT $Pb(Zr, Ti)O_3$, BST $(Ba, Sr)TiO_3$ and ST $SrTiO_3$. The formula $Pb(Zr, Ti)O_3$ represents $PbZr_xTi_{1-x}O_3$. The proportion of Zr and Ti in this substrate can vary. The ratio of Zr and Ti is a definitive determining factor for the temperature response of this dielectric, i.e. determining the temperature below which the substrate has ferroelectric properties and above which the substrate has paraelectric properties. The formula $(Ba, Sr)TiO_3$ represents $Ba_xSr_{1-x}TiO_3$, and the temperature response for this substrate may be definitively determined by the ratio of Ba to Sr. The list of these substances is by no means complete. The selection of one of the substances as a storage dielectric depends ultimately on processing factors during the production process, but also on factors during the use of the semiconductor memory configuration, for example the ambient temperature.

Other features which are considered as characteristic for the invention are set forth in the appended claims.

Although the invention is illustrated and described herein as embodied in a process for producing an integrated semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows a plan view of the semiconductor memory configuration shown in FIG. 1a;

DESCRIPTION OF THE PREFERRED EMBODIMENTS

In the following figures, identical reference numerals denote identical parts with the same meaning, unless stated otherwise. FIGS. 1a to 1e are sectional diagrams showing a number of process steps used to produce an integrated semiconductor memory configuration.

Figure 1A:
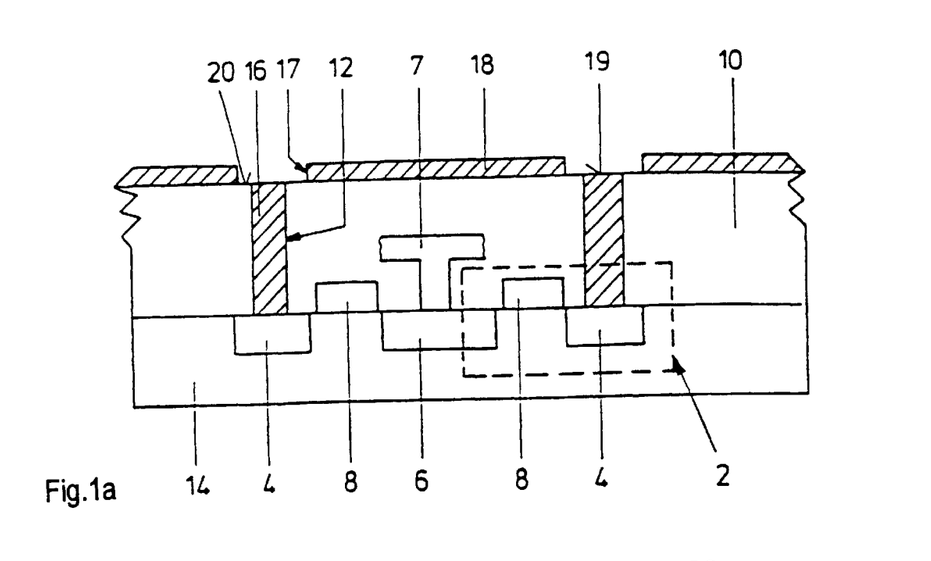
FIG. 1a is a cross section showing a semiconductor memory configuration produced after various process steps in a first embodiment of a process for producing a semiconductor memory configuration.

FIG. 1a is a cross section of a configuration of selection transistors 2 which has a semiconductor body 14 with an insulation layer 10 configured above it. Two selection transistors 2 shown in the figure have a common drain region 6 and each have a source region 4 and a gate 8. The source 4 and drain regions 6 are located in the semiconductor body 14, whereas the gate 8 is configured in the insulation layer 10 situated above the latter and is isolated from the semiconductor body 14 by part of the insulation layer 10. The gate 8 configured in the insulation layer 10 may be made of polysilicon, for example. The source 4 and drain regions 6 can be regions of the semiconductor body 14 that are doped so as to complement the conduction type of the semiconductor body 14. A bit line 7 is connected to the common drain region 6 of the two selection transistors 2. In the insulation layer 10 above the source regions 4, there is a respective contact hole 12 containing a first contact plug 16 that is electrically connected to a respective one of the source regions 4. A first main surface 20 of the insulation layer 10 has a first electrode 18 configured on it. The first electrode 18 is formed with cutouts 17 so that surfaces 19 of the first contact plugs as well as regions of the first main surface 20 that are adjacent to the surfaces 19 are exposed at the top. A layer of adhesion promoter, for example, titanium dioxide TiO$_2$, may be applied between the first electrode 18 and the insulation layer 10 in order to achieve improved adhesion between the first electrode 18 and the insulation layer 10.

For clarity, the semiconductor body 14 as well as the selection transistors 2 and the bit line 7 are not shown in the following figures. None of the figures show further wiring planes of the semiconductor memory configuration.

Figure 2:
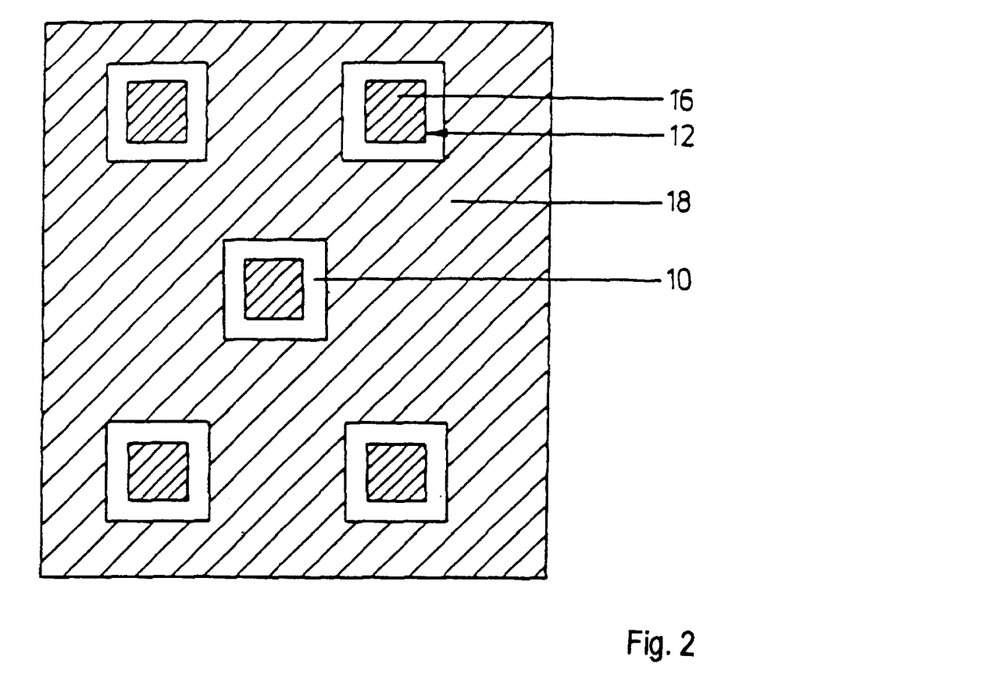

FIG. 2 is a plan view of the configuration shown in FIG. 1a. FIG. 2 shows the first electrode 18, which in the illustrated example has five square cutouts, so that the contact plugs 16 as well as adjacent regions of the first main surface 20 of the insulation layer 10 are exposed at the top.

Figure 1B:
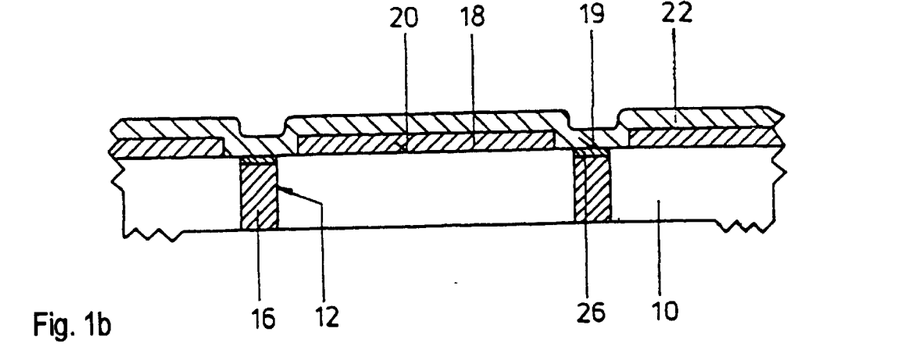
FIG. 1b is a cross section showing the semiconductor memory configuration after certain additional process steps have been performed.

FIG. 1b is a cross section showing the configuration illustrated in FIG. 1a after a further process step, in which a dielectric layer 22 has been deposited toward or in the direction of the first main surface 20 of the insulation layer 10. The first electrode 18, the surfaces 19 of the first contact plugs 16 and the regions of the first main surface 20 that are exposed by the cutouts 17 in the first electrode 18 are covered by the dielectric 22. In addition, FIG. 1b shows oxidized regions 26 of the first contact plugs 16, that can result during deposition of the dielectric layer 22 at high temperatures in an oxygen-containing atmosphere.

Figure 1C:
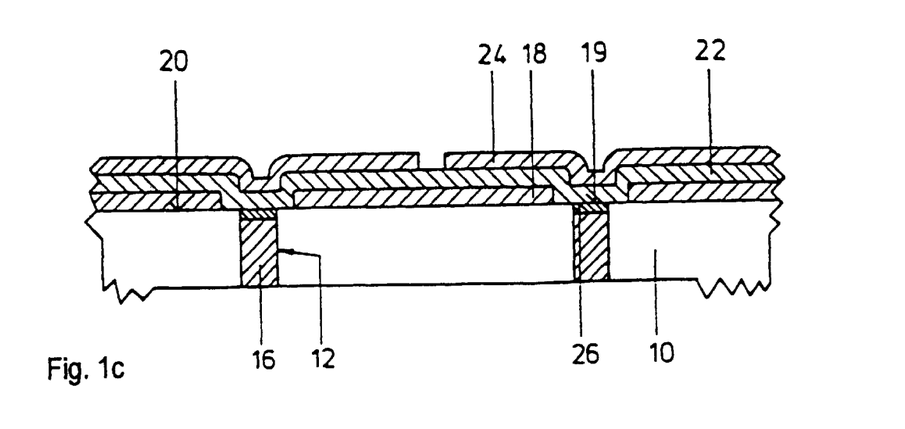
FIG. 1c is a cross section showing the semiconductor memory configuration after certain additional process steps have been performed.

FIG. 1c is a cross section showing the configuration illustrated in FIG. 1b after further process steps, in which second electrodes 24 have been produced over the dielectric layer 22. The second electrodes 24 may be produced, for example, by depositing a second layer of electrode material in the direction of the first main surface 20. The second layer is subsequently subdivided, for example by anisotropic etching, into separate sections to form a number of second electrodes 24. The first electrode 18, the dielectric layer 22 and the second electrodes 24 form storage capacitors for the semiconductor memory configuration. The first electrode 18 is common to a number of storage capacitors in the exemplary embodiment shown.

Figure 3:
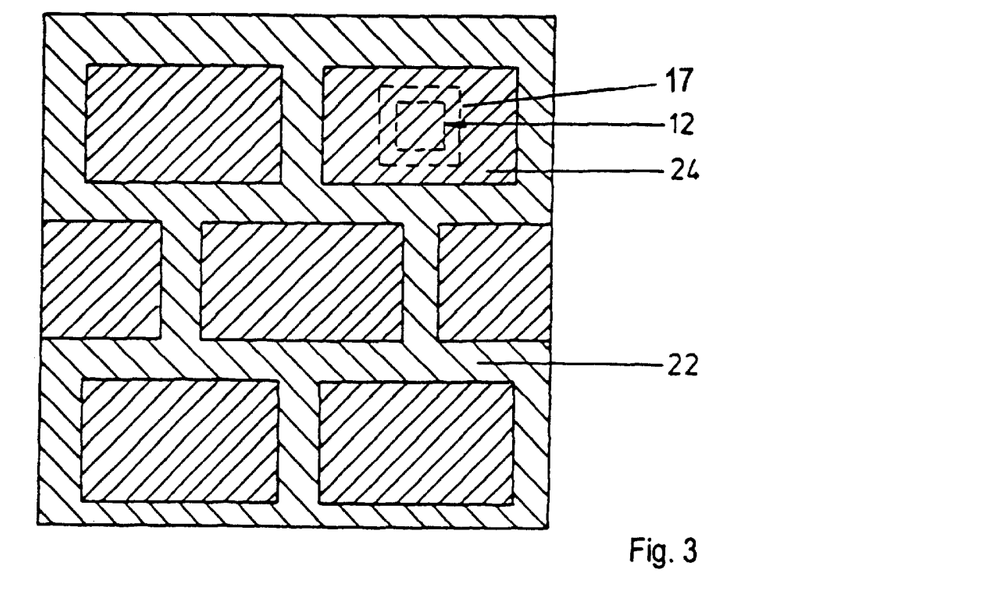
FIG. 3 shows a plan view of the semiconductor memory configuration shown in FIG. 1c.

FIG. 3 shows a plan view of the configuration illustrated in FIG. 1c. The second electrodes 24 as well as the dielectric layer 22 exposed between the second electrodes 24 are shown. In addition, FIG. 3 uses dashed lines to indicate one of the contact holes 12 and one of the cutouts 17 in the first electrode 18 below one of the second electrodes 24.

Figure 1D:
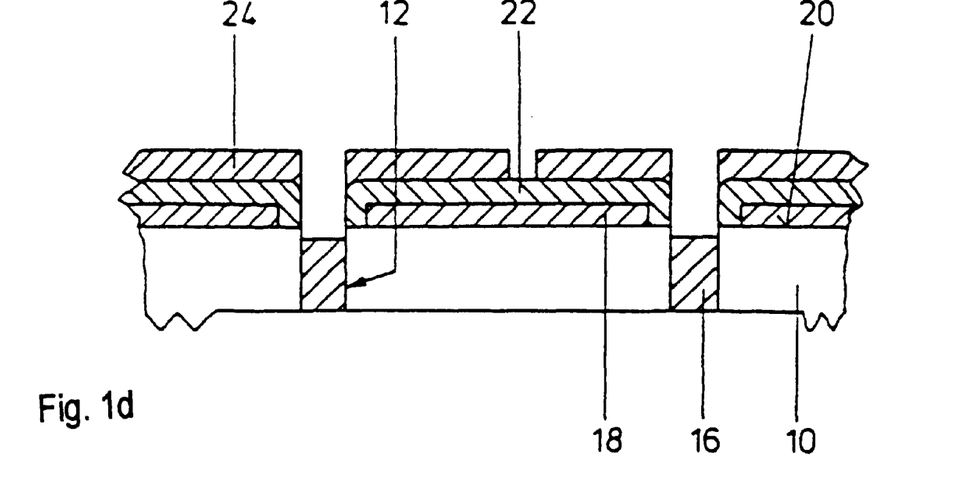
FIG. 1d is a cross section showing the semiconductor memory configuration after certain additional process steps have been performed.

FIG. 1d is a cross section showing the configuration illustrated in FIG. 1c after a further process step, in which the first contact plugs 16 have been exposed at the top by partial removal of the dielectric layer 22 situated above the contact plugs 16 and by partial removal of the second electrodes 24 at the top. During the process step of exposing the first contact plugs 16, the oxidized regions 26 of the contact plugs 16 are also removed. The first contact plugs 16 may be exposed, for example, by anisotropically etching the dielectric layer 22 and the second electrodes 24.

Figure 1E:
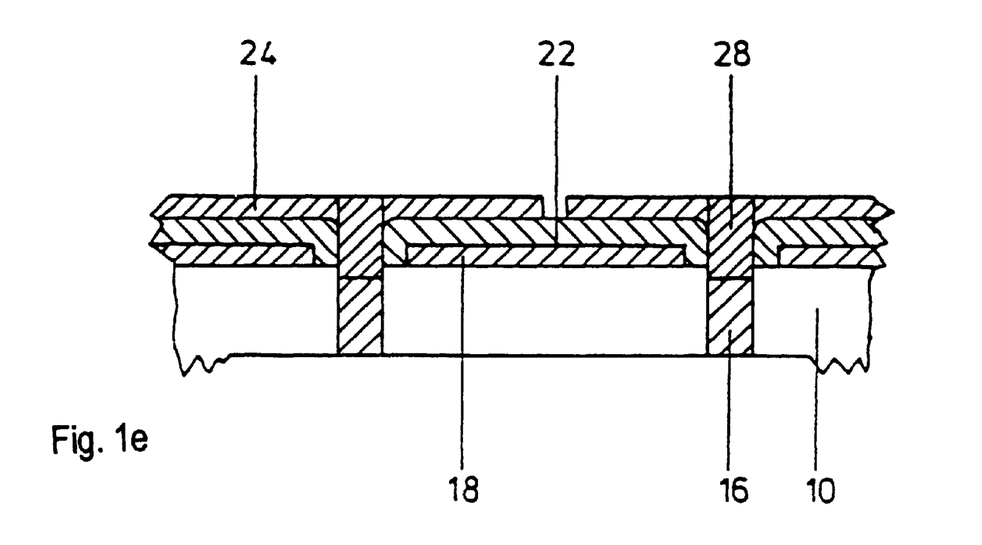
FIG. 1e is a cross section showing the semiconductor memory configuration after certain additional process steps have been performed.

FIG. 1e is a cross section showing the configuration illustrated in FIG. 1d after a further process step, in which second contact plugs 28 have been produced above the exposed first contact plugs 16. Each of the first contact plugs 16 are electrically connected through one of the second contact plugs 28 to just one of the second electrodes 24. There are a large number of electrically conductive materials that may be used as the material for the two contact plugs 16, 28 and the electrodes 18, 24. In particular, platinum is highly suitable both as the electrode material and as the material for the second contact plugs 28. Another suitable material, for example, is polysilicon.

As shown in FIGS. 1d and 1e, when the first contact plugs 16 are exposed, part of the dielectric layer 22 is retained above the first main surface 20 around the contact holes 12. This part of the dielectric layer 22 isolates the second contact plugs 28 from the first electrode 18.

If no further processes which may lead to oxidation of the first contact plugs 16 follow deposition of the dielectric layer 22, then it is conceivable for the first contact plugs 16 to be exposed directly after the dielectric layer 22 has been deposited and for the second electrodes 24 to be produced after that, so that there is no need for the second contact plugs 28 to be produced in an individual process step.

Figure 4A:
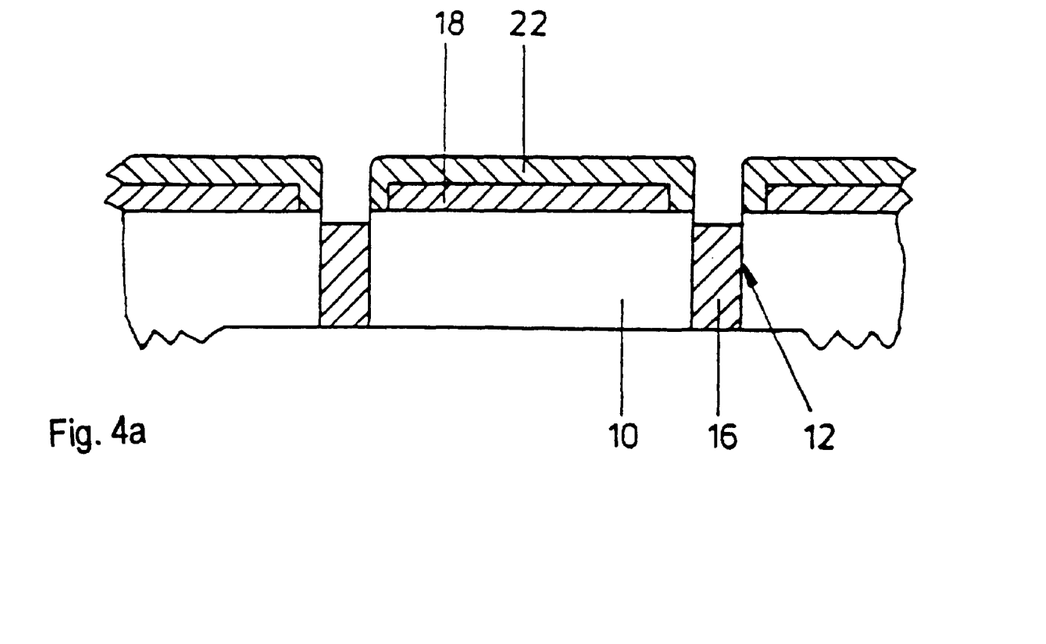
FIG. 4a is a cross section showing a semiconductor memory configuration produced after various process steps in a second embodiment of a process for producing a semiconductor memory configuration.
Figure 4B:
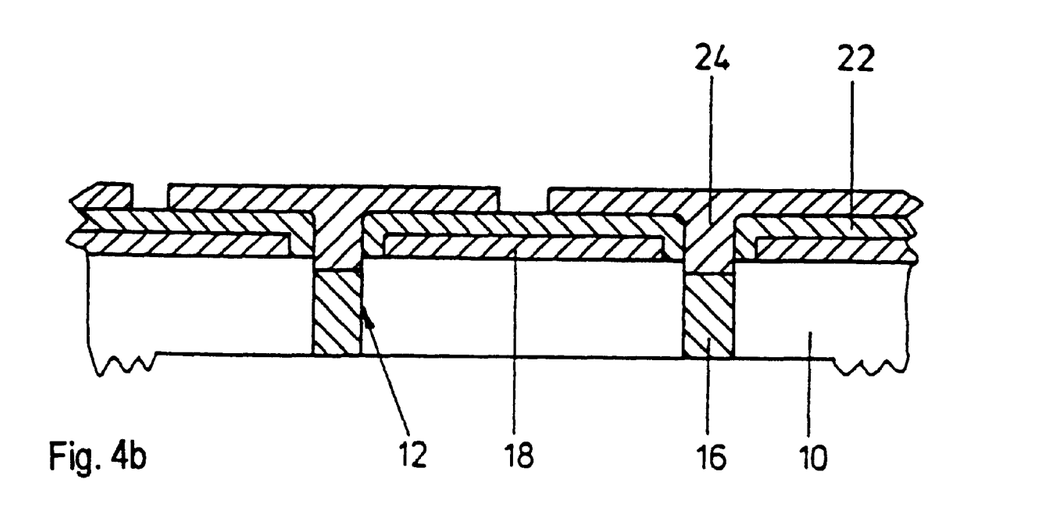
FIG. 4b is a cross section showing a semiconductor memory configuration produced after further various process steps in a second embodiment of a process for producing a semiconductor memory configuration.

This modified process is shown in FIGS. 4a and 4b. FIG. 4a is a cross section showing the configuration illustrated in FIG. 1b, in which the dielectric layer 22 has been deposited over the first electrode 18 and the first contact plugs 16, as well as over exposed regions of the first main surface 20, in which a further process step has been performed to expose the top of the first contact plugs 16. The first contact plugs 16 may be exposed, for example, by anisotropically etching the dielectric layer 22 situated above the first contact plugs 16. Using this procedure, part of the dielectric layer 22 remains behind on the first main surface 20 adjoining the contact holes 12.

FIG. 4b is a cross section showing the configuration illustrated in FIG. 4a after a further process step, in which second electrodes 24 have been produced over the dielectric layer 22 and are in direct electrical contact with the first contact plugs 16. It is possible to dispense with subsequent production of second contact plugs 28 (See FIG. 1e), as the second contact plugs 28 are an integral part of the second electrodes 24. The second electrodes 24 can be produced, for example, by depositing a second layer of electrode material in the direction of the first main surface 20, with the second layer subsequently being subdivided into sections of equivalent size forming the second electrodes 24. A plan view of the configuration shown in FIG. 4b is equivalent to the plan view of a semiconductor memory configuration shown in FIG. 3.

Another embodiment of the process according to the invention provides for an auxiliary layer 30 to be applied over the first main surface 20 of the insulation layer 10 of the configuration of selection transistors 2 before the first layer of electrode material is deposited.

Figure 5A:
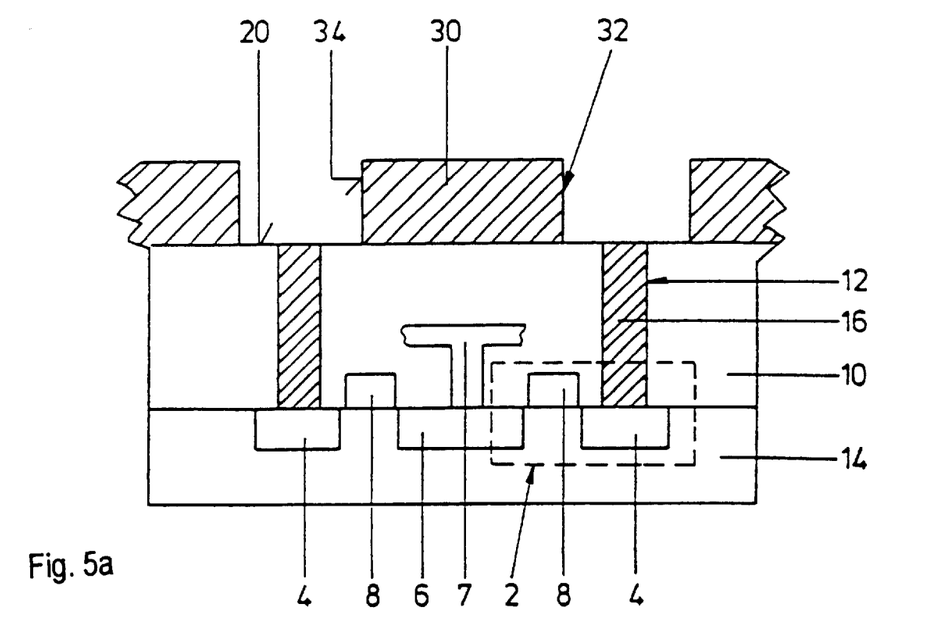
FIG. 5a is a cross section showing a semiconductor memory configuration produced after various process steps in a third embodiment of a process for producing a semiconductor memory configuration.

FIG. 5a is a cross section showing a configuration of selection transistors 2 where an auxiliary layer 30 formed with cutouts 32 has been applied on the first main surface 20. The cutouts 32 are designed so that the tops of the first contact plugs 16 as well as regions of the first main surface 20 adjacent the contact holes 12 are exposed.

The subsequent process steps, production of the first electrode 18, deposition of the dielectric layer 22, production of the second electrodes 24, exposure of the first contact plugs 16 and possibly production of second contact plugs 28 are carried out in a similar manner to that previously described.

Figure 5B:
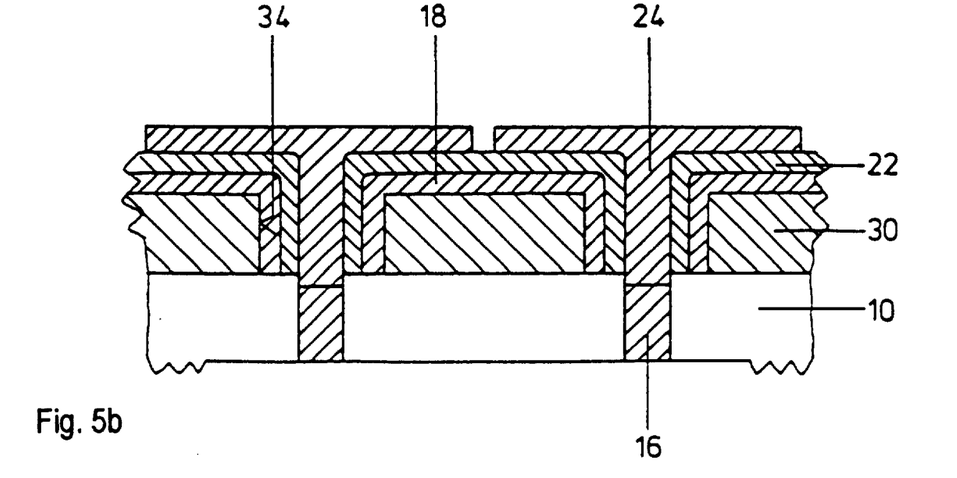
FIG. 5b is a cross section showing a semiconductor memory configuration produced after further various process steps in a third embodiment of a process for producing a semiconductor memory configuration.

FIG. 5b is a cross section showing a semiconductor memory configuration produced using this process, in which the first contact plugs 16 have been exposed subsequent to depositing the dielectric layer 22, so that the second electrodes 24 can be directly conductively connected to the first contact plugs 16. FIG. 5b clearly shows that the surface area of storage capacitors formed from a first electrode 18, a dielectric layer 22 and a second electrode 24 is larger when an auxiliary layer 30 is used as compared to the surface area of storage capacitors produced without the use of an auxiliary layer, as shown in FIG. 1c or FIG. 4b. The increase in the surface area of the storage capacitor is caused by the enlarged lateral surfaces 34 of the auxiliary layer 30 that are used for producing the storage capacitors.

Figure 6A:
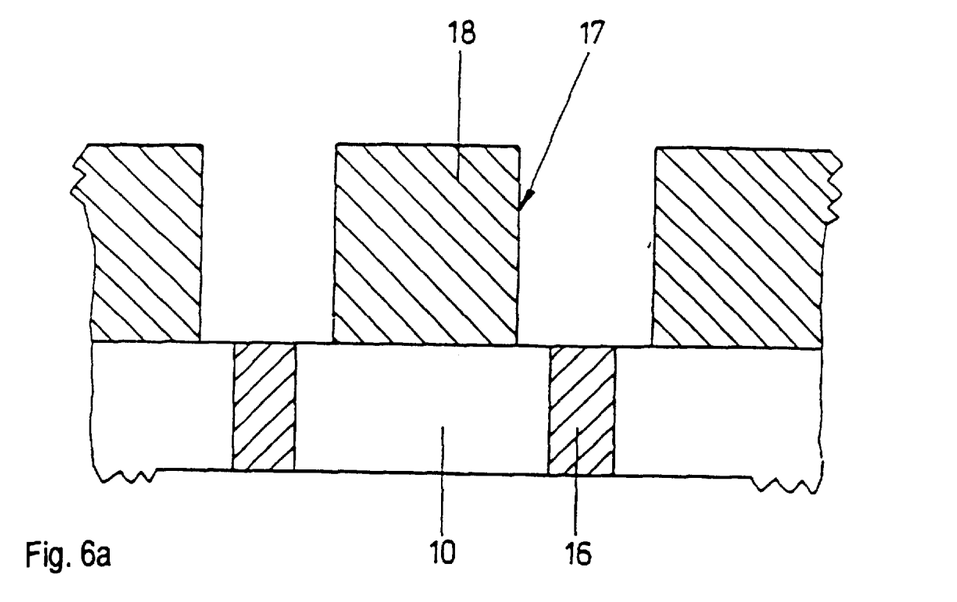
FIG. 6a is a cross section showing a semiconductor memory configuration produced after various process steps in a fourth embodiment of a process for producing a semiconductor memory configuration.
Figure 6B:
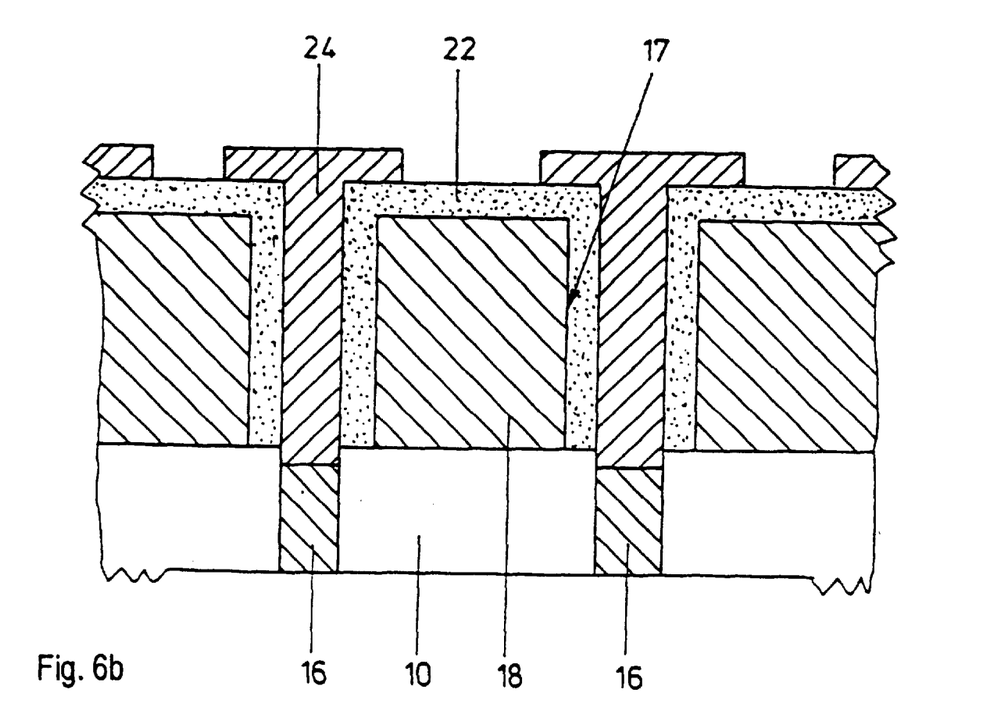
FIG. 6b is a cross section showing a semiconductor memory configuration produced after further various process steps in a fourth embodiment of a process for producing a semiconductor memory configuration.

When a tall first electrode 18 is applied to the first main surface 20, the auxiliary layer 30 for enlarging the surface area of the storage capacitor may be dispensed with, as shown in FIG. 6a. After the storage dielectric 22 has been deposited and the second electrodes 24 have been produced, the semiconductor memory configuration shown in cross section in FIG. 6b is produced. The storage capacitor is formed by the first and second electrodes 18, 24 and by the intermediate storage dielectric 22.

Figure 7:
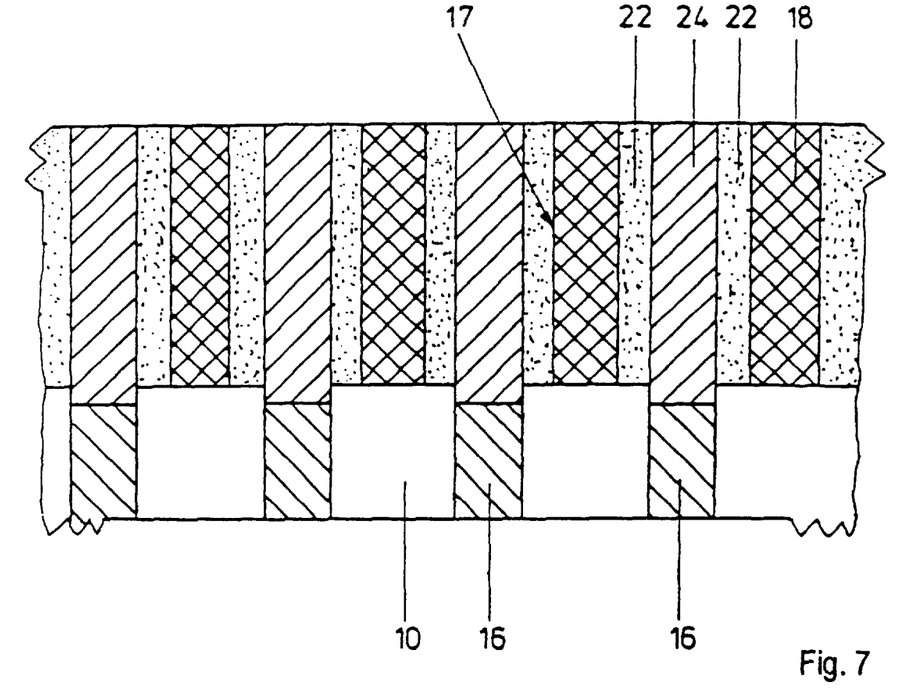
FIG. 7 is a cross section showing a variation of the semiconductor memory configuration produced using the fourth embodiment of the process for producing a semiconductor memory configuration.
Figure 8:
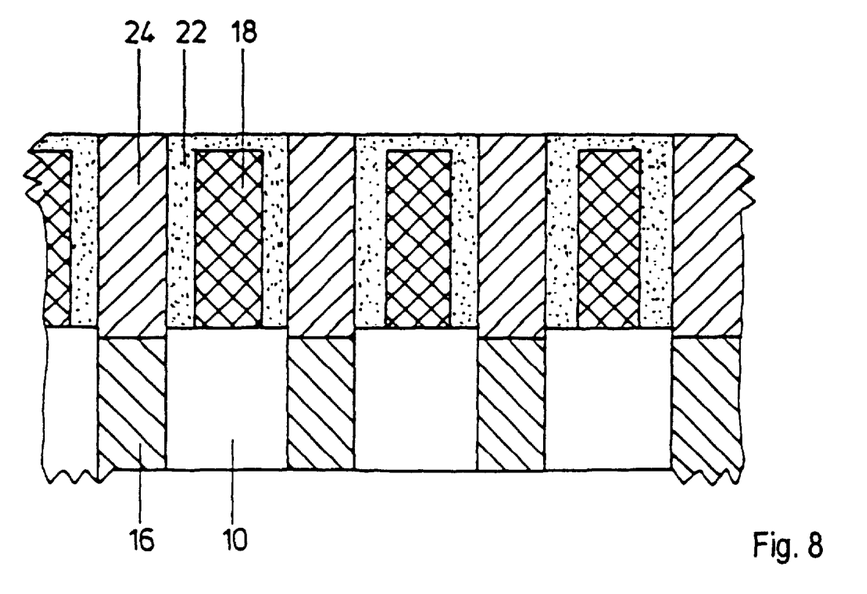
FIG. 8 is a cross section showing a variation of the semiconductor memory configuration produced using the fourth embodiment of the process for producing a semiconductor memory configuration.

FIG. 7 is a cross section of the semiconductor memory configuration illustrated in FIG. 6, in which, in the step for structuring the second layer of electrode material for producing second electrodes 24, the second layer of electrode material and the storage dielectric 22 have been completely removed from regions of the first electrode 18 that run parallel to the first main surface 20. The second electrodes 24 are situated completely inside the cutouts 17 in the first electrode 18 and are isolated from the latter by the storage dielectric 22. The first electrodes 18 are exposed at the top. In contrast, in the exemplary embodiment shown in the cross section of FIG. 8, one layer of the storage dielectric 22 is retained above the first electrodes 18 for insulation. Back etching of the second electrodes 24 may be done by gas phase etching, for example.

We claim:

1. A process for producing an integrated semiconductor memory configuration, which comprises:

providing a configuration of selection transistors having source regions and an insulation layer formed with contact holes extending through to the source regions;

subsequently providing first contact plugs in the contact holes;

subsequently applying at least one first electrode on a surface of the insulation layer; and forming the first electrode with cutouts exposing surfaces of the first contact plugs and regions of the surface of the insulation layer adjacent the contact holes;

subsequently depositing a dielectric layer on the surfaces of the first contact plugs, the regions of the surface of the insulation layer adjacent the contact holes, and the first electrode;

subsequently depositing a second layer of electrode material on the dielectric layer;

subsequently separating the second layer of electrode material into sections to produce second electrodes;

subsequently exposing the surfaces of the first contact plugs by etching the dielectric layer and the second electrodes and removing oxidized regions of the contact plugs; and subsequently producing second contact plugs above the exposed first contact plugs electrically connecting a respective one of the second electrodes to a respective one of the first contact plugs.

2. The process according to claim 1, wherein the first electrode application step is performed by depositing a layer of electrode material; and the step of forming cutouts is performed by removing the layer of electrode material from the surfaces of the first contact plugs and regions of the surface of the insulation layer adjacent the contact holes.

3. The process according to claim 1, which further comprises before the first electrode application step, applying a structured auxiliary layer on the surface of the insulation layer; and forming the structured auxiliary layer with cutouts exposing surfaces of the first contact plugs and regions of the surface of the insulation layer adjacent the contact holes.

4. The process according to claim 3, which further comprises selecting a material having ferroelectric properties as the dielectric layer.

5. The process according to claim 1, which further comprises selecting a material having ferroelectric properties as the dielectric layer.

6. The process according to claim 1, which further comprises selecting a material having a dielectric constant greater than 10 as the dielectric layer.

7. The process according to claim 1, which further comprises selecting an oxide-containing material selected from the group consisting of $SrBi_2(Ta_{1-x}Nb_x)_2O_9$, $Pb(Zr, Ti)O_3$, $(Ba, Sr)TiO_3$, and $SrTiO_3$ as the dielectric layer.

8. The process according to claim 1, wherein the dielectric layer and the second electrodes are etched anisotropically.

* * * * *